(12) United States Patent
Toda et al.

(10) Patent No.: US 6,335,545 B1
(45) Date of Patent: *Jan. 1, 2002

(54) LIGHT EMITTING DIODE ELEMENT

(75) Inventors: Hidekazu Toda; Shinji Isokawa, both of Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,838

(22) Filed: Dec. 29, 1998

(30) Foreign Application Priority Data

Jan. 29, 1998 (JP) .......................... 10-055662

(51) Int. Cl.[7] .............................................. H01L 33/00
(52) U.S. Cl. .......................... 257/94; 257/103; 257/102
(58) Field of Search .......................... 257/94, 102, 103, 257/618

(56) References Cited

U.S. PATENT DOCUMENTS

| 4,316,208 A | * | 2/1982 | Kobayashi et al. ........... 357/55 |
| 5,006,908 A | * | 4/1991 | Matsuoka et al. ............ 357/17 |
| 5,898,185 A | * | 4/1999 | Bojarczuk, Jr. et al. .... 257/103 |
| 5,977,566 A | * | 11/1999 | Okazaki et al. ............... 257/99 |
| 5,990,495 A | * | 11/1999 | Ohba .......................... 257/94 |

* cited by examiner

Primary Examiner—Olik Chaudhuri
Assistant Examiner—Douglas A. Wille
(74) Attorney, Agent, or Firm—Sughrue Mion, PLLC

(57) ABSTRACT

A low temperature buffer layer made of GaN is formed on a sapphire substrate and an n type layer is formed thereon. An active layer is made of an InGaN based compound semiconductor. A GaN based compound semiconductor layer including an n-type layer, an active layer serving as a light emitting layer, and a p type layer are laminated on the sapphire substrate. A current diffusion film which is formed on the p-type layer for supplying the light emitting layer with a uniform current is formed of an electrically conductive metal having a high reflectance factor for light. The light emitting diode element is mounted on a circuit board so that the output light of the light emitting layer is emitted from the side of the sapphire substrate. Reflected light which is reflected on the current diffusion film is also emitted from the sapphire substrate.

6 Claims, 1 Drawing Sheet

LIGHT EMITTING DIODE ELEMENT

U.S. Pat. No. 6,184,544 entitled Semiconductor Light Emitting Device and U.S. patent application Ser. No. 09/221,839 entitled Semiconductor Light Emitting Device both naming the inventors Hidekazu Toda and Shinji Isokawa, and both filed on the same day as the present application and incorporated herein by references.

BACKGROUND OF THE INVENTION

1. Field of the Invention

The present invention relates to a light emitting diode element, the light emission efficiency of which is improved by emitting the light from a light emitting layer externally thereof without any loss.

2. Description of the Related Art

As one example of light emitting diode element (hereinafter abbreviated as "LED element") nitride compound based blue color LED element 10 having a light emitting layer made of GaN, InGaN has been known. FIG. 1 is a front view, partly in longitudinal cross section, showing the structure of the LED element 10 of this type. A reference numeral denotes a sapphire substrate, on which a low temperature buffer layer 2 made of GaN is formed. An n-type layer 3 is formed on the GaN buffer layer 2. The n-type layer 3 is of the laminate layer structure of GaN compound semiconductor including, for example, n-type GaN current diffusion layer and AlGaN clad layer. The low temperature buffer layer 2 made of GaN serves to improve the crystal quality of the semiconductor of the n-type layer 3 formed thereon.

An active layer 4 which is formed of, for example InGaN based compound semiconductor constitutes a light emitting layer. A p-type layer 5 is formed on the active layer 4. The p-type layer 5 is of the laminate structure of GaN based compound semiconductor including for example, p-type GaN current diffusion layer and an AlGaN clad layer. In such a manner, the GaN based compound semiconductor layer including the n-type layer 3, the active layer 4 serving as a light emitting layer and the p-type layer is laminated on the sapphire substrate.

A current diffusion film of an appropriate electrically conductive material is formed on the p-type layer 5 in a planar manner for supplying a uniform current to the light emitting layer. An n side electrode 7 is formed on the surface of the n-type layer 3. A p side electrode 8 is formed on the surface of the current diffusion film 6. An LED element 10 of this type is mounted on a circuit board on the side of the sapphire substrate 1 so that output light is emitted from the light emitting layer on the side of the current diffusion film 6. A given wiring pattern is formed on the circuit substrate. Conduction of a current through the n and p side electrodes 7 and 8 of the LED element 10 causes the output light E to be emitted from the LED element 10 via the current diffusion film 6.

In such a manner, conventional LED element 10 is mounted on the circuit board on the sapphire substrate 1 on which a given wiring pattern is formed so that output light is emitted from the current diffusion film 6. However, the light transmission factor of the current diffusion film 6 which is formed of an appropriate electrically conductive material is in the order of 50 to 60% at most. 40 to 50% of the emitted light is lost when the output light emitted from the light emitting layer is transmitted through the current diffusion film 6. Therefore, there is a problem in that the light emission efficiency of the LED element 10 is lowered.

SUMMARY OF THE INVENTION

The present invention is made in view of the above-mentioned problem.

It is an object of the present invention to provide an LED element having an improved light emission efficiency by externally emitting the output light from the light emitting layer without any loss.

The above-mentioned object of the present invention is accomplished by providing a light emitting diode element having a sapphire substrate, a GaN based compound semiconductor film forming a light emitting layer which is laminated on said substrate and a current diffusion film which is formed on the semiconductor layer, in which said current diffusion film is formed of an electrically conductive metal film having a high reflectance factor for light and said light emitting diode element is mounted on a circuit board so that output light of the light emitting layers emitted from the sapphire substrate side together with light reflected on the current diffusion film.

In an aspect of the present invention, a light emitting diode element is mounted on a circuit board so that output light of a light emitting layer is reflected on a current diffusion film and then emitted from the sapphire substrate side. Therefore, the current diffusion film which otherwise lowers the light emission efficiency to the light emitting layer is utilized as means for enhancing the output light. The light emission efficiency of the light emitted diode is remarkably improved.

DESCRIPTION OF THE PREFERRED EMBODIMENT

Figure 1:
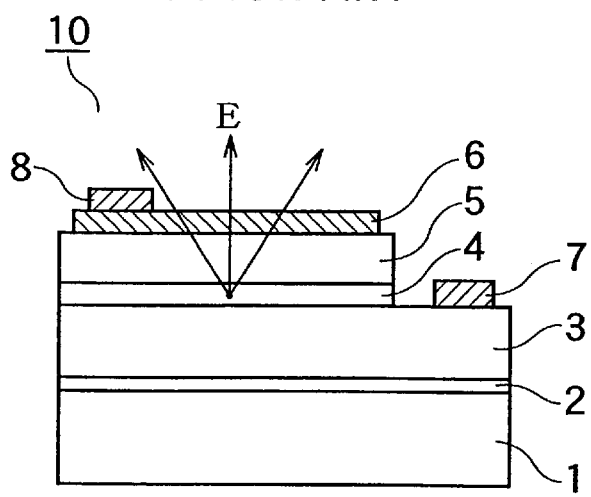
FIG. 1 is a front view, partly in longitudinal section, showing a prior art light emitting diode element.
Figure 2:
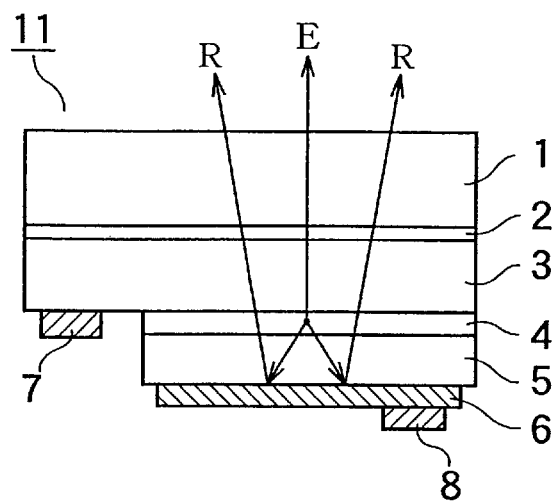
FIG. 2 is a front view, partly in longitudinal section, showing the light emitting diode element of the embodiment of the present invention.
Figure 3:
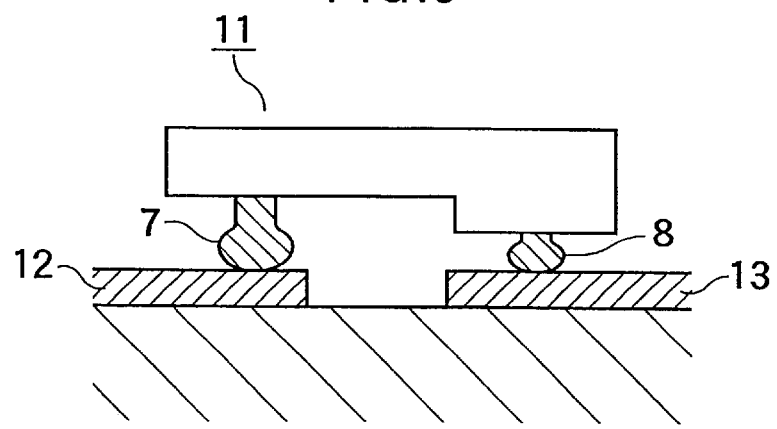
FIG. 3 is a schematic view showing the light emitting die-bonded to the circuit board of the embodiment of the present invention.

Now, an embodiment of the present invention will be described with reference to drawings. FIG. 2 is a front view, partly in longitudinal section, showing the structure of an LED element 11 which is an embodiment of the present invention. Elements which are identical or relevant to those in FIG. 1 are designated with identical numerals. Detailed description of the identical or relevant elements will be omitted. In the present invention, a current diffusion film 6 is formed of a metal having an electrical conductivity and high reflectance factor. The metal having such characteristics may include Al, Ni, Ti, Pt, etc. The current diffusion film 6 made of one of these metals is formed on a p-type clad layer 5 in a planar manner.

The LED element 11 of the present invention is mounted on the circuit board including the wirings 12, 13 (or on a lead frame, not shown) so that output light E is emitted from the light emitting layer on the sapphire substrate 1. On mounting of the LED element 11 on the circuit board, one side of the LED element 11 on which the n and p side electrodes 7 and 8 are formed is die-bonded to a lead frame or a metallized wired insulating substrate by using an electrically conductive material as bonding material. Mounting the LED element 11 on the circuit board in such a manner enables the output light E directly emitted from the LED element 11 via the sapphire substrate 1 to be added with the light R reflected on the current diffusion film 6 so that resultant added light is emitted from the sapphire substrate 1.

On mounting LED element 11 on the circuit board, the present invention advantageously utilizes the fact that the sapphire substrate 1 has light transmission characteristics, which has heretofore been disposed on the opposite side where the output light of the light emitting layer is emitted. The LED element is mounted on the circuit board so that the output light of the light emitting layer is emitted from the sapphire substrate 1.

In order to the light emitting layer is supplied with a uniform current in such an LED element, a current diffusion film has been formed on a p-type clad layer. In the present invention, the current diffusion film is formed of a metal having a high reflectance for light so that it can be used as a reflector for the output light from the light emitting layer.

In accordance with the present invention, the LED element is mounted on the circuit board so that output light of the light emitting layer which is formed between the sapphire substrate and the current diffusion film is emitted from the sapphire substrate side and the output light of the light emitting layer is reflected on the current diffusion film by forming the current diffusion film of a metal having a high reflectance factor for light and is emitted from the sapphire substrate. In other words, the feature of the present invention resides in that the current diffusion film which otherwise decreases the output light from the LED element is utilized as means for increasing the output light emitted from the LED element.

Since the light emitting diode element is mounted on the circuit board so that the output light of the light emitting layer is reflected on the current diffusion film and is emitted from the sapphire substrate side in accordance with the present invention as mentioned above, the current diffusion film which has heretofore decreased the output light of the light emitting layer can be utilized as output light enhancing means. Thus luminosity efficiency of the light emitting diode element can be remarkably improved.

What is claimed is:

1. A light emitting diode element comprising:

a sapphire substrate;

a GaN based compound semiconductor film forming a light emitting layer and defining an area, which is laminated on said sapphire substrate;

a current diffusion film, comprising a metal and being formed over said light emitting layer, said film being electrically conductive, covering substantially all of said area and having a high reflectance factor for light, and an electrode formed on the current diffusion film and covering substantially less than all of said area.

2. A light emitting diode element comprising:

a sapphire substrate;

a GaN based compound semiconductor film forming a light emitting layer and defining an area, which is laminated on said sapphire substrate;

a current diffusion film, comprising a metal and being formed over said light emitting layer, said film being electrically conductive, covering substantially all of said area and having a high reflectance factor for light;

an electrode formed on the current diffusion film and covering substantially less than all of said area; and a circuit board; wherein said light emitting diode element is mounted on said circuit board so that output light of the light emitting layer is emitted from the sapphire substrate side directly together with light reflected by the current diffusion film.

3. A light emitting diode element as defined in claim 1, wherein the current diffusion film is made of one of those metal as Al, Ni, Ti, or Pt.

4. A light emitting diode element as defined in claim 2, wherein the current diffusion film is made of one of those metal as Al, Ni, Ti or Pt.

5. A light emitting diode element comprising:

a sapphire substrate;

a GaN based compound semiconductor film forming a light emitting layer, which is laminated on said sapphire substrate;

a clad layer over said light emitting layer and defining an area;

a current diffusion film, comprising a metal and being formed over said clad layer, said film being electrically conductive, covering substantially all of said area and having a high reflectance factor for light; and an electrode formed on the current diffusion film and covering substantially less than all of said area.

6. A light emitting diode element as defined in claim 5, wherein the current diffusion film comprises at least one of Al, Ni, Ti or Pt.

* * * * *